(12) United States Patent
Zolotorev

(10) Patent No.: US 7,755,069 B2
(45) Date of Patent: Jul. 13, 2010

(54) ULTRA-BRIGHT PULSED ELECTRON BEAM WITH LOW LONGITUDINAL EMITTANCE

(75) Inventor: Max Zolotorev, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 431 days.

(21) Appl. No.: 11/749,747

(22) Filed: May 16, 2007

(65) Prior Publication Data

US 2008/0173829 A1 Jul. 24, 2008

Related U.S. Application Data

(60) Provisional application No. 60/747,404, filed on May 16, 2006.

(51) Int. Cl.
*G21G 1/12* (2006.01)
*G21K 5/02* (2006.01)
(52) U.S. Cl. .............. 250/493.1; 250/492.3; 250/423 R
(58) Field of Classification Search .............. 250/493.1, 250/492.3, 492.1, 423 R, 425, 427, 306, 307, 250/309, 310, 311, 494.1, 424; 315/111.01, 315/111.11, 111.21, 111.31, 111.41, 111.81, 315/111.91
See application file for complete search history.

(56) References Cited

U.S. PATENT DOCUMENTS 6,061,379 A * 5/2000 Schoen ..................... 372/76

OTHER PUBLICATIONS

Zolotorev, et al., "An Ultra-Bright Pulsed Electron Beam with Low Longitudinal Emittance", Proc. of 2005 Particle Accelerator Conference, pp. 770-772, (May 16-20, 2005).
Zolotorev, et al.,"Proposal for a High Brightness Pulsed Electron Source", "The Physics & Applications of High Brightness Electron Beams", pp. 1-7, (Oct. 9-14, 2005).
Zolotorev, et al., "Theory and proposal for a quantum-degenerate electron source",Ernest Orlando Lawrence Berkeley Nat. Lab., LBNL Formal Report, LBNL-61587 (Sep. 2006).
Zolotorev, et al., "Proposal for a Quantum-degenerate Electron Source", Physical Review Letters, vol. 98, pp. 184801-1-184801-4, (May 3, 2007).

* cited by examiner

*Primary Examiner*—David A Vanore
*Assistant Examiner*—Nicole Ippolito Rausch
(74) *Attorney, Agent, or Firm*—Lawrence Edelman; Lawrence Berkeley National Laboratory

(57) ABSTRACT

A high-brightness pulsed electron source, which has the potential for many useful applications in electron microscopy, inverse photo-emission, low energy electron scattering experiments, and electron holography has been described. The source makes use of Cs atoms in an atomic beam. The source is cycled beginning with a laser pulse that excites a single Cs atom on average to a band of high-lying Rydberg nP states. The resulting valence electron Rydberg wave packet evolves in a nearly classical Kepler orbit. When the electron reaches apogee, an electric field pulse is applied that ionizes the atom and accelerates the electron away from its parent ion. The collection of electron wave packets thus generated in a series of cycles can occupy a phase volume near the quantum limit and it can possess very high brightness. Each wave packet can exhibit a considerable degree of coherence.

2 Claims, 7 Drawing Sheets

| | |
|---|---|
| In an interaction region, defined by overlap of lasers, on average one Cs atom per laser pulse is excited to a Rydberg state very close to vacuum (~-$10^{-5}$ eV). | 300 |
| After the laser pulse, the electron takes about 40 ns to reach the turning point of its classical orbit (~70 µm from nucleus) where its kinetic energy is negligible. | 310 |
| When the electron reaches the turning point, a short pulsed voltage ionizes the atom, extracts the electron from the interaction region and takes it to a second region of the source. | 320 |
| In this second region, the electron is accelerated by a DC voltage to the source operation energy. | 330 |
| After the electron leaves the second region, a "cleaning" pulsed field removes the residual ion before the beginning of the next cycle. | 340 |

FIG. 3

ULTRA-BRIGHT PULSED ELECTRON BEAM WITH LOW LONGITUDINAL EMITTANCE

CROSS-REFERENCE TO RELATED APPLICATIONS

This application claims priority to U.S. Patent Provisional Application 60/747,404, filed May 16, 2006, which is incorporated by reference herein.

STATEMENT OF GOVERNMENTAL SUPPORT

The invention described and claimed herein was made in part utilizing funds supplied by the U.S. Department of Energy under Contract No. DE-AC03-76SF00098, and more recently under DE-AC02-05CH11231. The government has certain rights in this invention.

BACKGROUND OF THE INVENTION

Most existing electron sources extract electrons from conductors. There are several disadvantages associated with currently-available electron beam sources. The Fermi temperature of the extracted electrons is significantly lower than the electrons remaining in the source, so the electron degeneracy $\delta_f$ (brightness in inverse Compton wavelength units) is close to 1, the maximum allowed by the Pauli exclusion principle. Other factors conspire together to reduce $\delta_f$ many orders of magnitude during extraction. Interactions with the collective electric field (space charge) and with randomly positioned electrons in the beam further decrease the beam brightness. In the case of field emitters, large inhomogeneities in the electric field near the tip also degrade brightness considerably. For example, a state of the art room-temperature field-emitter can produce a DC beam with $\delta_f \approx 10^{-5}$, while high-current pulsed RF photoinjector sources for high-energy accelerators strive to produce a beam with $\delta_f = 2.5 \times 10^{-12}$, both significantly lower than the theoretical limit.

Herein, a new concept is described for building a novel electron source designed to produce a pulsed beam with $\delta_f \approx 0.6$ and longitudinal emittance four orders of magnitude smaller than currently achieved values. This high brightness, low longitudinal emittance pulsed electron source enables a wide range of novel applications that utilize angstrom-scale spatial resolution and µeV-scale energy resolution.

BRIEF DESCRIPTION OF THE DRAWINGS

The foregoing aspects and others will be readily appreciated by the skilled artisan from the following description of illustrative embodiments when read in conjunction with the accompanying drawings.

FIG. 3 is a flow chart that outlines a method of producing an electron beam, according to an embodiment of the invention.

DETAILED DESCRIPTION

Figure 1:
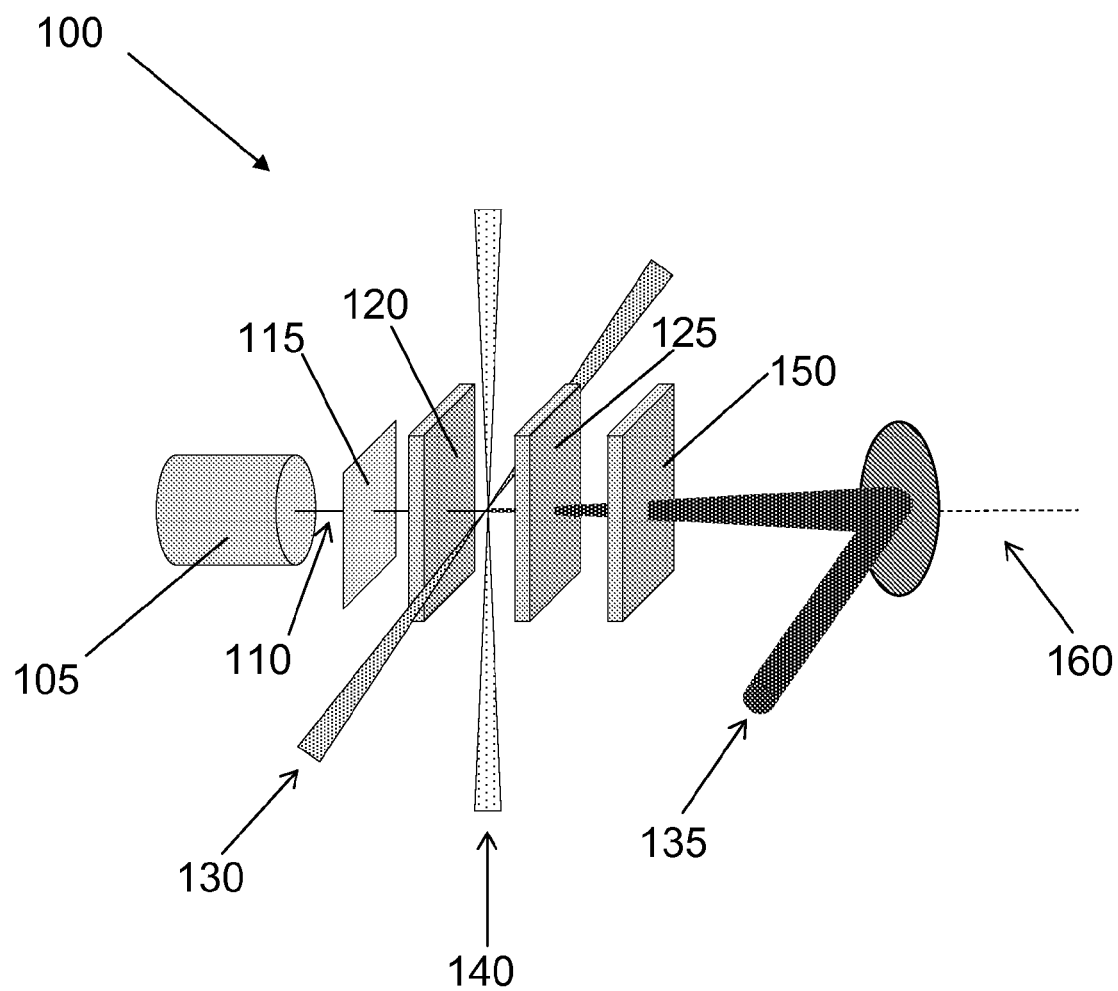
FIG. 1 is a schematic diagram of a pulsed electron source, according to an embodiment of the invention.

A novel scheme for a high-brightness pulsed electron source, which has the potential for many useful applications in electron microscopy, inverse photo-emission, low energy electron scattering experiments, and electron holography is disclosed herein. The source makes use of neutral atoms in an atomic beam. Each cycle of the source begins with a laser pulse that excites a single atom on average to a band of high-lying Rydberg nP states. The resulting valence electron Rydberg wave packet evolves in a nearly classical Kepler orbit. When the electron reaches apogee, an electric field pulse is applied that ionizes the atom and accelerates the electron away from its parent ion. The collection of electron wave packets thus generated in a series of cycles can occupy a phase volume near the quantum limit and it can possess very high brightness. Each wave packet can exhibit a considerable degree of coherence. In one arrangement, the electron energy is in the 10-100 eV range The source has the capability of approaching the brightness quantum limit and of lowering the effective temperature of the electrons orders of magnitude as compared to existing sources. Such a device can open the way for a wide range of novel applications that utilize angstrom-scale spatial resolution and µeV-scale energy resolution. Examples of applications include electron microscopy, inverse photo-emission, and low energy electron scattering experiments, electron holography, and investigations of dynamics on a picosecond time scale using pump-probe techniques. Without wishing to be bound to any particular theory, the concepts for such a source are disclosed below. Several phenomena taken into consideration for construction of the disclosed electron source are also discussed.

The source can use, as starting material, an atomic beam of alkali atoms, such as Li, Na, K, Rb, and Cs. Exemplary embodiments of the invention are described with reference to a Cs source, but of course, embodiments using other alkali atoms are also possible. Cesium can be useful because of its high vapor pressure at room temperature. The high atomic weight and significant vapor pressure at low temperatures minimize the effective temperature of the electron due to the thermal motion of the atom.

Without wishing to be bound to any particular theory, some physics background is presented. In the rest-frame of a beam of electrons propagating in the z direction, the dimensionless differential phase volume $d\Gamma$ is:

$$d\Gamma = \frac{1}{h^3} dx\, dp_x\, dy\, dp_y\, dz\, dp_z \qquad (1)$$
$$= \frac{dx\, d\beta_x\, dy\, d\beta_y\, dz\, d\beta_z}{(2\pi)^3 \lambdabar_C^3}$$

where $\beta_{x,y,z} = v_{x,y,z}/c$ and c is the velocity of light, and $\lambdabar_C = \hbar/m_e c = 3.86 \times 10^{-11}$ cm is the electron Compton wavelength. Assuming that the electron beam is described by a six-dimensional Gaussian distribution in phase space, the total dimensionless phase volume $\Gamma$ occupied by the electron beam may be expressed in terms of the transverse emittances $\epsilon_{x,y}$ and longitudinal emittance $\epsilon_z$ as follows:

$$\Gamma = \frac{\varepsilon_x \varepsilon_y \varepsilon_z}{\lambda_C^3} \quad (2)$$

where $$\varepsilon_x = \sqrt{(\langle x^2 \rangle - \langle x \rangle^2)(\beta_x^2) - \overline{\langle x\beta_x \rangle}^2} \quad (3)$$

with similar definitions for $\epsilon_y$ and $\epsilon_z$. Let $N_e$ be the actual number of electrons, and consider the ratio:

$$\delta_F = \frac{N_e}{\Gamma} = \lambda_C^3 \frac{N_e}{\varepsilon_x \varepsilon_y \varepsilon_z} = \lambda_C^3 B \quad (4)$$

where $B = N_e/\epsilon_x \epsilon_y \epsilon_z$ is the "brightness". The Pauli exclusion principle requires $\delta_F \leq 1$ for electrons of a given spin polarization; hence $\epsilon_x \epsilon_y \epsilon_z \geq \lambda_c^3$. Typically, field emission electron guns of modern design achieve $\delta_F$ up to $5 \times 10^{-6}$. For the present electron source it appears possible to reach $\delta_F \approx 2 \times 10^{-2}$.

The terms degeneracy and brightness are used interchangeably in this disclosure. The usual definition of brightness for a beam is:

$$B = \frac{N}{\epsilon_x \epsilon_y \epsilon_z}$$

where N is the average number of electrons per pulse. However, emittances are expressed as dimensionless quantities in Compton wavelength units:

$$\lambda_c^2 \epsilon_x^2 = \overline{(x-\bar{x})^2 (\beta_x - \bar{\beta}_x)^2} - \overline{(x-\bar{x})(\beta_x - \bar{\beta}_x)}^2$$

Using this definition of emittance, brightness and degeneracy are equal.

Figure 2:
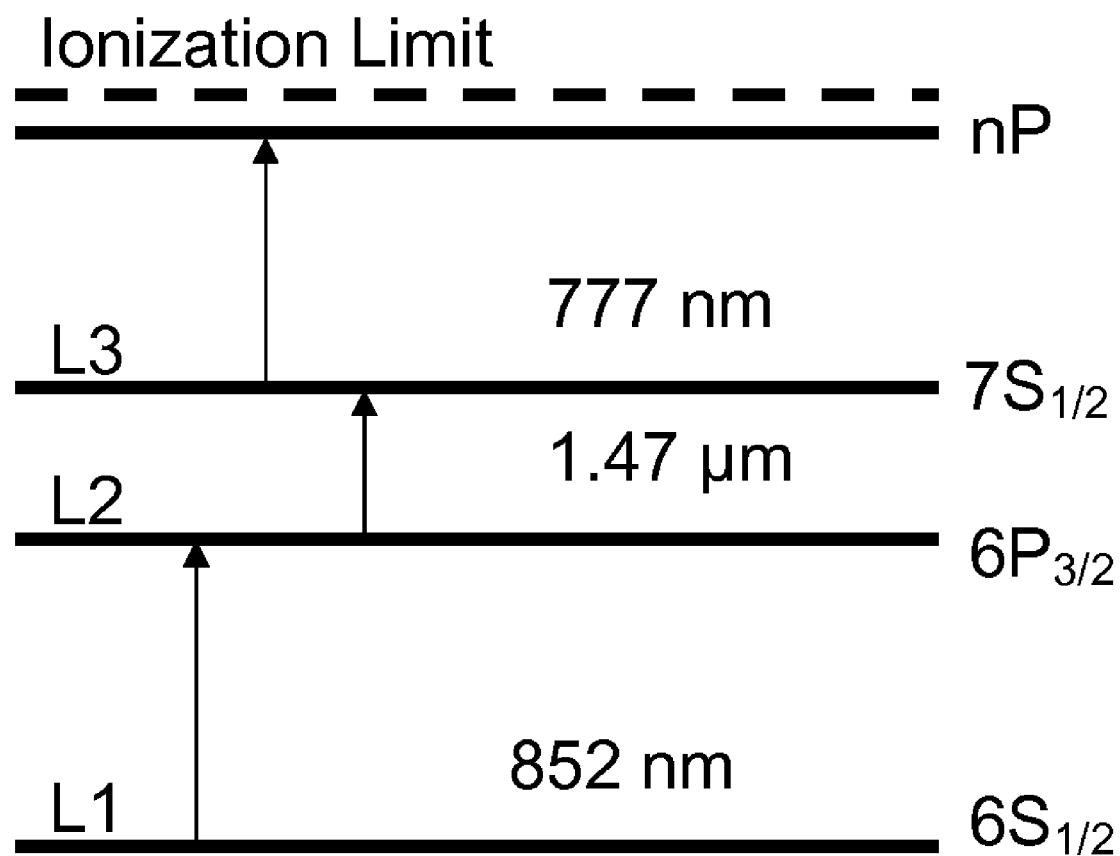
FIG. 2 is a diagram of Cesium energy levels.

An exemplary embodiment of an electron source 100 is illustrated in FIG. 1. An effusive source 105, such as a Cesium (Cs) oven operating at a temperature of about 500K, generates a beam of neutral Cs atoms 110. The atomic beam 110 can be collimated by passing through a pinhole aperture 115 to reduce the transverse beam temperature to about 5K. Transverse cooling using the $6^2S_{1/2}$–$6P_{3/2}$ Cs resonance line can be employed also to reduce this temperature to ≈0.01 K. The collimated atomic beam 110 continues into an interaction volume about 10×10×10 μm³ about midway between two plane parallel electrodes 120, 125 that are separated by a distance of about 1 cm and defined by three overlapping and mutually perpendicular laser beams 130, 135, 140, from lasers $L_1$, $L_2$, $L_3$ (only beams are shown), respectively. Heating is avoided by using the laser beams 130, 135, 140 to excite one atom at a time, on average, to a very high lying band of nP Rydberg states (for example $\bar{n}$≈800, Δn≈50). The laser beams 130, 135 are made from continuous wave (CW) lasers which excite about a quarter of the atoms through two transitions to the $7S_{1/2}$ state. FIG. 2 is a diagram of Cesium energy levels. The third laser 140 is a pulsed laser which excites on average about one atom per pulse up to an extreme Rydberg state (very close to vacuum—about $-10^{-5}$ eV). For an exemplary embodiment using Cs atoms, the laser properties are shown in Table I.

TABLE I

|  | Laser 1 ($L_1$) | Laser 2 ($L_2$) | Laser 3 ($L_3$) |
|---|---|---|---|
| Wavelength, λ | 852 nm | 1470 nm | 777 nm |
| Cs Transition | $6S_{1/2}$-$6P_{3/2}$ | $6P_{3/2}$-$7S_{1/2}$ | $7S_{1/2}$-nP |
| Mode | CW | CW | Pulsed |
| Average Power | 0.1 mW | 0.1 mW |  |
| Peak Power |  |  | 30 W |
| Pulse Length |  |  | 2.5 ns FWHM |
| Rep. Rate |  |  | 10 MHz |

In the exemplary embodiment shown in FIG. 1, laser beam 135 along the beam axis can be used to select a narrow band of longitudinal velocities. Thus excited atoms can have a thermal energy spread $\Delta E \leq 10^{-6}$ eV, and if the valence electrons are optically excited to ionization threshold (ignoring subsequent space-charge heating), the electron energy spread is $\delta E = (m_e/M_{Cs})\Delta E \leq 10^{-11}$ eV. On the other hand, if many atoms were excited in a given pulse, space-charge interactions would result in an electron temperature given by $kT \approx e^2 n_e^{1/3}$ where $n_e$ is the electron density. For example, given a laser-atom interaction volume ≈$10^{-9}$ cm³ and $n_e \approx 10^{10}$ cm$^{-3}$, so that only ≈10 electrons are generated simultaneously, space-charge interaction would yield $\delta E \approx 10^{-4}$ eV.

The electron in the excited atom has a large kinetic energy and starts to drift away from the atom. After the laser pulse, it takes the electron about 40 ns, in its extreme elliptical classical orbit, to travel from its initial position a few atomic radii from the Cs nucleus to approximately 65-70 μm from the Cs nucleus. In this position, the electron reaches the turning point (apogee) of its orbit where its kinetic energy is negligible. At the orbit apogee, the electron in the Rydberg state is nearly stationary with minimal momentum spread, and distributed within a thick spherical shell with angular distribution 1+3 $\cos(\theta)^2$ about the polarization axis of the pulsed laser. At this point, a short pulsed voltage ionizes the atom, extracts the electron from the interaction region and moves the electron through the electrode 125. When an electron is at the apogee point as described above, a Cs atom can be ionized, for example, with a 1 ns pulse of a 30 V/cm electric field. For a pulse peak=100 V/cm and FWHM=0.5 ns, the final electron energy is E≈2 eV, with $\Delta E \approx 10^{-4}$ eV. Several ns after the accelerating pulse, the electron reaches electrode 125 and passes through a circular aperture. The diameter of the aperture can be chosen to minimize aberrations and simultaneously to maintain reasonable field uniformity in the excitation region.

Because the electron is so far (approximately 65-70 μm) from the Cs ion, Coulomb interactions with the parent Cs ion introduce minimal increase in emittance and decrease in brightness.

After ionization, the electron exits the interaction volume through an aperture in the electrode 125 and into a second region where it is accelerated by an electrode 150 with a DC field to the source operating energy. Then the electron leaves the second region and moves on to one or more electron optics modules (not shown) which can manipulate the distribution of the electron beam 160 in 6-D phase space as desired to form an electron beam suitable for an intended application.

After the electron leaves the second region, a "clearing" pulsed field removes the residual ionized Cs atom from the interaction volume in preparation for receiving and ionizing another neutral Cs atom, i.e., before the beginning of the next cycle. Thus the residual ion is no longer in the interaction volume where it could interact with an electron produced in the next cycle.

Since each ion is cleared away before the next electron is produced, Coulomb interactions between the electron and previously produced ions are eliminated. Because the electrons are produced one by one, space charge problems are eliminated. Since the electrons are nearly stationary when ionized by the homogeneous ionizing field, they emerge from the atom with very small temperature (approximately $10^{-9}$ eV). This more than compensates for the relatively large volume within which the electron is extracted. All these factors work together to yield a beam with $\delta_f \approx 0.6$.

Figure 4:
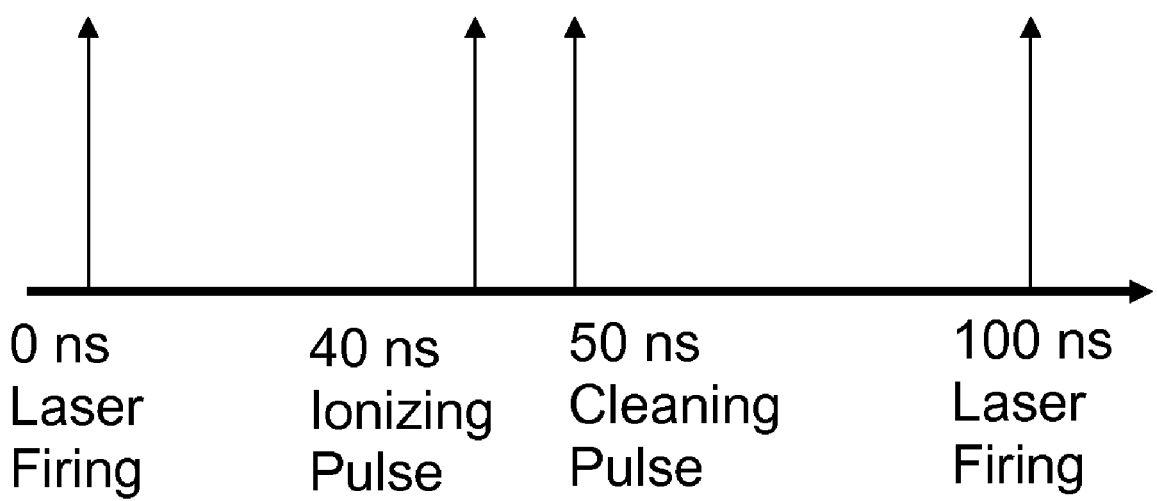
FIG. 4 is a time-line showing a timing sequence within one cycle of the method of FIG. 3.

A process for producing an electron beam, according to an embodiment of the invention, is outlined in FIG. 3. FIG. 4 is a time-line showing a timing sequence within one cycle of the method of FIG. 3.

Each cycle of the device 100 begins with a laser pulse that excites a single Cs atom, on average, to a band of high-lying Rydberg nP states. The radial motion of the resulting shell-like valence-electron Rydberg wave packet is nearly classical, describing an elliptical orbit with very high eccentricity. When the electron reaches the orbit apogee far away from the parent atom, an electric field pulse is applied that ionizes the atom and accelerates the electron away from its parent ion. The electron bunch thus generated in a train or series of cycles can occupy a phase volume near the quantum limit and possess very high brightness. Appreciable phase coherence in each electron wave packet can be achieved. Thus the source may be employed to observe coherence effects, e.g., electron holography and other interferometric experiments. As in any coherence experiment involving electrons, interference occurs between different paths over a single electron wave-packet, and successive wave packets are mutually incoherent. However if these packets are similar enough to one another, an interference pattern with significant visibility emerges from the train of pulses. It is possible to achieve such an interference pattern in some embodiments of the invention.

An electron source with these parameters can open a wide range of novel applications that utilize angstrom-scale spatial resolution and meV-scale energy resolution. Possible applications for this electron source include angstrom-scale resolution electron microscopy, electron holography, other interferometric experiments, and investigations of dynamics on a picosecond time scale using pump-probe techniques. By accelerating or decelerating the beam, one can adjust the energy and time uncertainties according to the requirements of the target application, subject to the constraint $\Delta E \Delta T/\hbar = \epsilon_z \approx 1.2$. In one example, the test beam has an energy spread of approximately $10^{-4}$ eV, which corresponds to about 30 ps jitter relative to the ionization pulse.

The resulting valence-electron Rydberg wave packet forms a spherical shell that expands radially in Kepler-like motion, with half-period $$T = \frac{\pi \hbar^3}{m_e e^4} \bar{n}^3.$$

(The value $\bar{n} \approx 800$ has been chosen as an example because in this case $T \approx 40$ ns, which makes possible a range of pulsed laser bandwidths convenient for chirping. However, $\bar{n} \approx 600$ might also be practical). The oscillator strengths for Cs $7S$-$nP_{3/2}$ transitions are much larger than for $7S$-$nP_{1/2}$ when $n \geq 15$. Taking into account this spin-orbit effect and assuming that the 777 nm photons are linearly polarized along z, the probability density of the Rydberg wave packet is proportional to $1+3 \cos^2 \theta$, where $\theta$ is the angle between the z axis and the electron position vector r.

The frequency of the 777 nm laser pulse can be chirped so that the classical Kepler orbits for various n values in the vicinity of n=800 all reach apogee simultaneously. The most favorable chirping parameters are found by optimizing a quantum mechanical calculation of laser excitation and subsequent time evolution of the Rydberg wave-packet.

Figure 5:
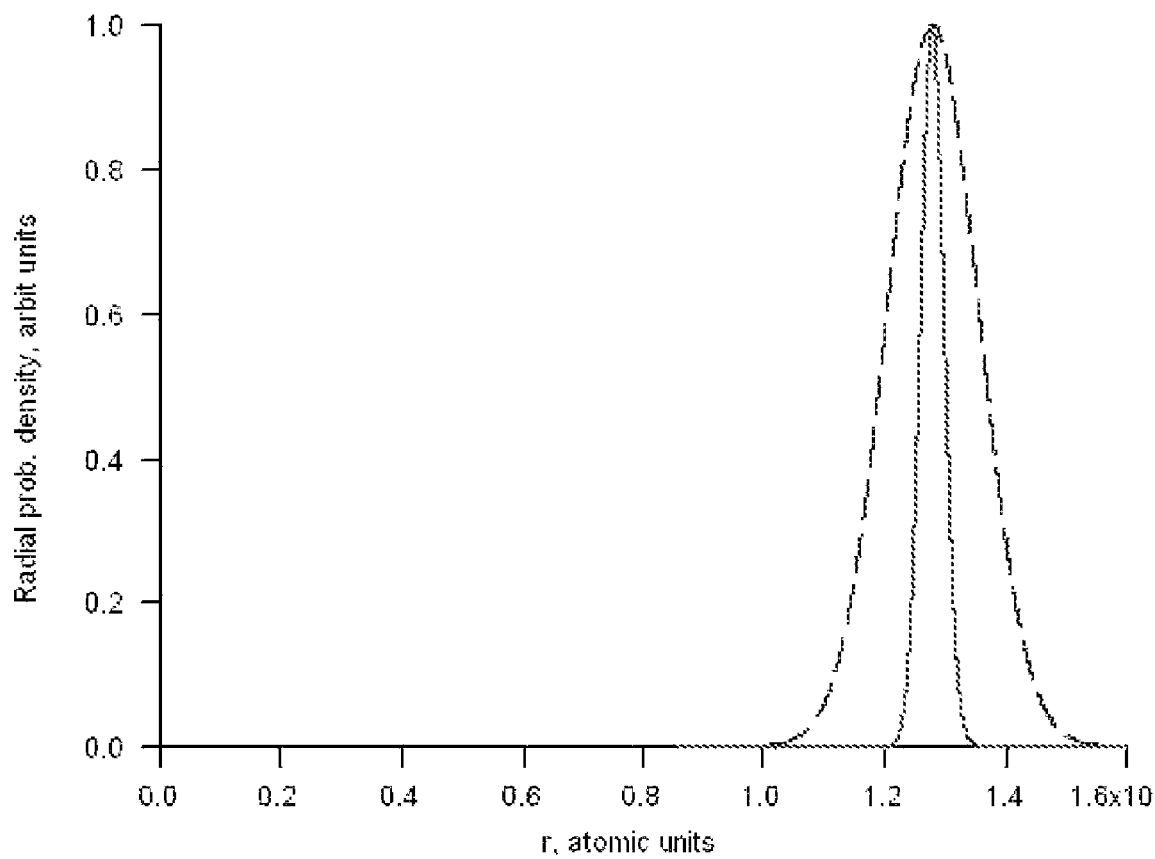
FIG. 5 shows radial probability distributions for a Rydberg wave packet at apogee. Solid curve: 777 nm laser pulse FWHM=2.35 ns, no chirp. Dashed curve: 777 nm laser pulse FWHM=8.2 ns, optimum chirp.
Figure 6:
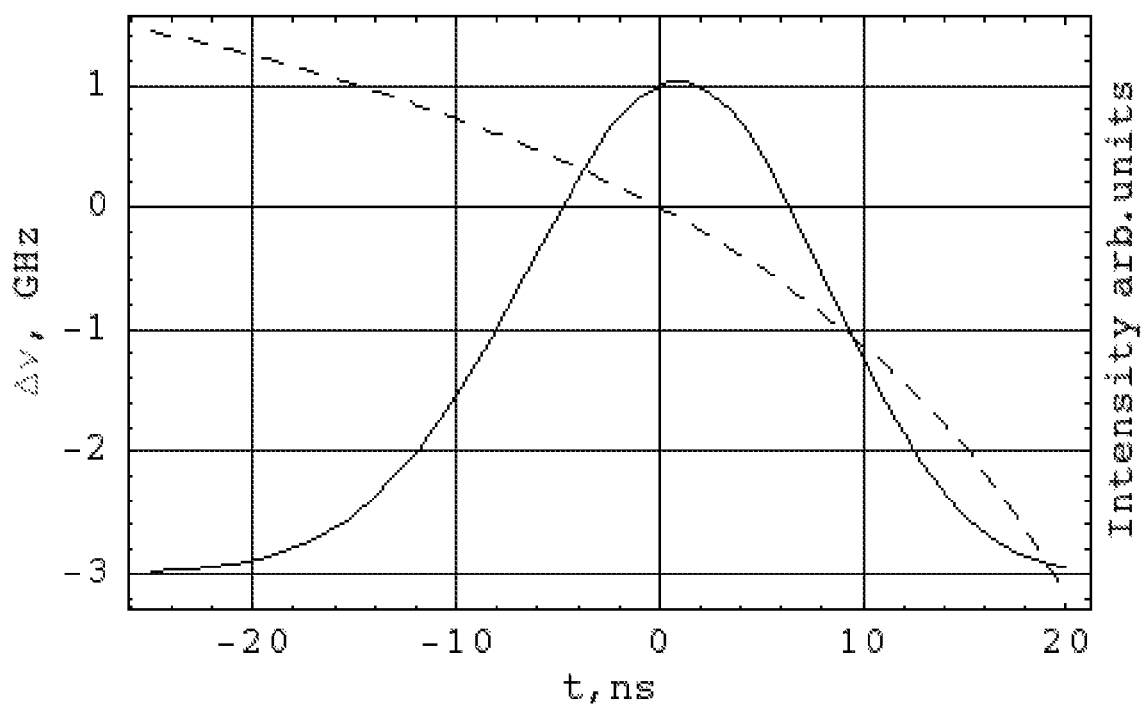
FIG. 6 shows 777 nm laser pulse intensity (solid curve) and change in frequency (dashed curve) for an optimum chirped pulse.

FIG. 5 shows radial probability distributions for a Rydberg wave at apogee for chirped and unchirped laser pulses. At apogee the wave packet fills a spherical shell centered on the remaining Cs ion, with mean shell radius $\langle R \rangle \approx 67$ μm and shell half-thickness $\Delta R \approx 6$ μm. It can be seen that is useful to have the shell width $\Delta R$ at apogee reasonably large, because this relaxes restrictions on V. Also it is desirable that the radial part F of the wave function describing the wave packet at apogee be real (apart from an arbitrary overall phase), so that the radial probability current density vanishes everywhere. These goals are achieved by suitable chirping in frequency of the 777 nm laser pulse. FIG. 6 shows the optimum laser intensity profile and frequency chirping for good performance.

Figure 7:
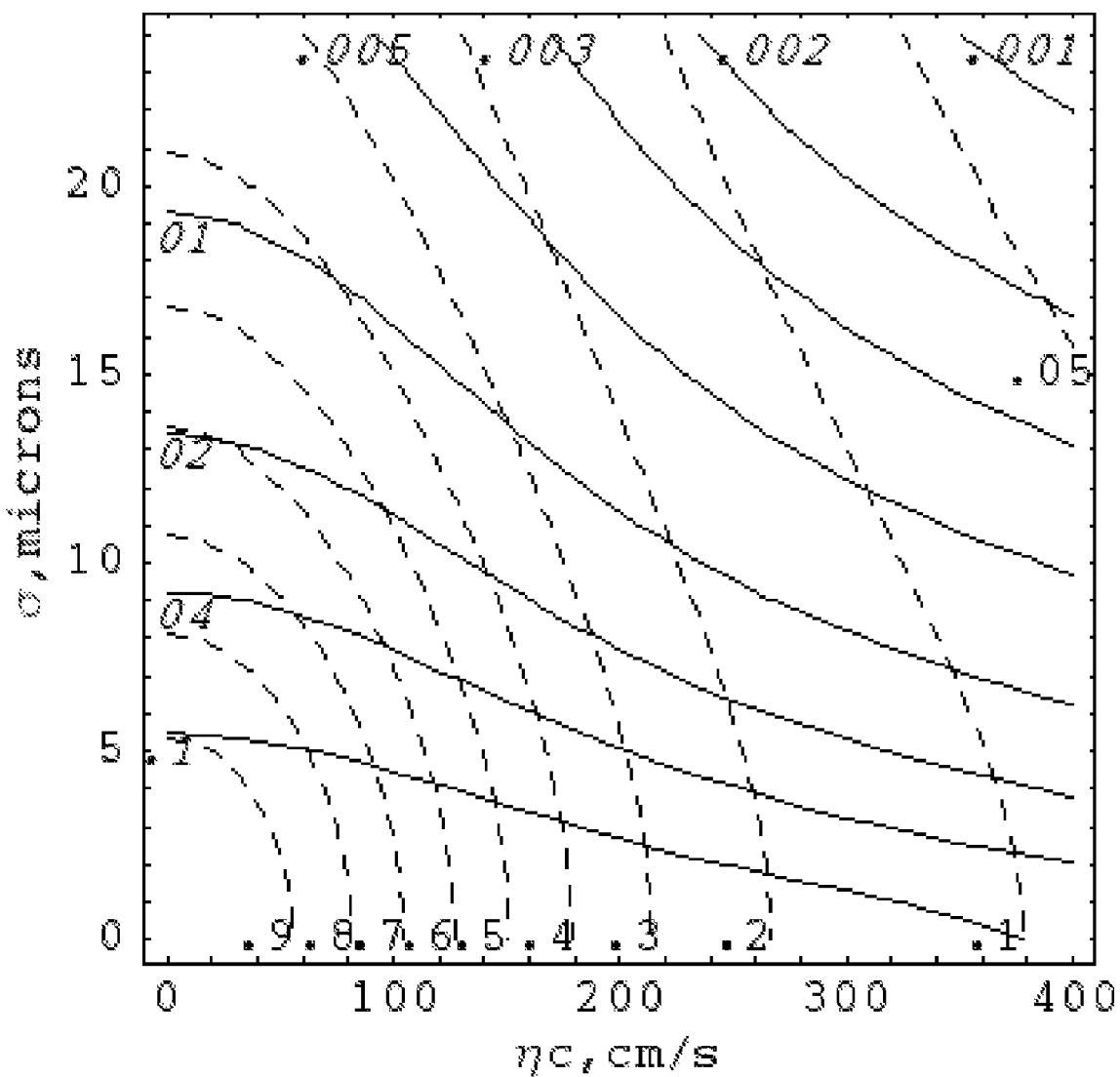
FIG. 7 shows curves of constant $\delta$ in the $\eta\sigma$ plane. Dashed curves correspond to chirping with $\Delta R=0.12R$. Solid curves correspond to no chirping with $\Delta R \approx 0.02R$.

FIG. 7 shows curves of constant $\delta$ for two cases: a) the chirped laser pulse with $\bar{n}$=800, $\Delta R$=0.12R; b) an unchirped Gaussian laser pulse amplitude with time dependence $$\exp\left(-\frac{t^2}{4\tau^2}\right).$$

In one arrangement, $\tau$=1 ns is chosen because it gives a wave packet with minimum uncertainty, $\Delta R \Delta p_R$ at apogee as a function of $\tau$ for $\bar{n}$=800. Here, $\Delta R \approx 0.02R$. The unchirped laser pulse yields a radial wave function at apogee with an r-dependent phase factor, and thus a radial probability current density that does not vanish identically. It appears practical to achieve $\sigma \approx 10$ microns and $\eta c \approx 100$ cm/s. Assuming this, FIG. 7 shows that for case a) $\delta \approx 0.6$, while for case b) $\delta \approx 0.03$. This shows the advantage of chirping and that substantial coherence effects can be realized.

At apogee, an electric field pulse with peak value $E_0$ and FWHM=$\tau_0$ can ionize the atom and accelerate the electron. It is desirable that $E_0$ and $\tau_0$ satisfy the following criteria: $\int E dt$ is the same for all electrons regardless of $\theta$ at apogee; the acceleration is rapid enough that Coulomb interaction between the electron and residual $Cs^+$ ion is minimal; and the final electron energy E is sufficiently large ($\approx$1-10 eV) that electron-optical aberrations on passing through subsequent apertures are minimal. Typical acceptable values are $E_0$=100 V/cm, $\tau$=0.5 ns. Because the electrons are close to the quantum-degenerate limit, $\Delta E \Delta t \sim h/2\pi$ where $\Delta t$ is the spread in electron arrival times. By a "rotation" in phase space, it is possible to vary $\Delta E$ at the expense of $\Delta t$ for as desired for individual applications. For example, in electron microscope and holographic experiments, very small $\Delta E$ ($\approx 10^{-7}$ eV) is desirable, while for pump-probe experiments with sub-picosecond resolution, a larger $\Delta E$ ($\approx 10^{-3}$ eV) can be used.

For a Rydberg atom with principal quantum number n, the electric field required for spontaneous ionization is $$E_I = \frac{e}{16 a_0^2 n^4} \approx 8 \cdot 10^{-4} \text{ V/cm for } n = 800.$$

Such a field can be generated by an electronic charge at a distance s=0.014 cm. Therefore it is desirable that when the next laser pulse occurs, the residual ion from the present pulse is at a distance s'>>s from the interaction region. To achieve this, after the acceleration pulse another "ion clearing" electric field pulse can be applied to remove the residual Cs ion from the interaction region. Because the ion is massive, it is desirable to use a clearing pulse with sufficient duration (e.g., ≈100 ns for a pulse amplitude of ≈1 kV/cm). In this example, a cycle repetition rate≈3 MHz can be achieved. At an average of one electron per pulse, this gives an average source current of about 0.5 pA. Of course, other combinations of clearing pulse duration, amplitude, and repetition are possible. Different combinations can yield different average source currents.

Stray electric fields and stray magnetic fields can cause undesirable perturbations that degrade brightness. It is desirable to reduce stray electric fields in the interaction region to a level $E_S = E_I$; that is to the level $E_S \leq 10^{-4}$ V/cm. Stray magnetic fields B can cause degradation unless the electron radius of curvature is much greater than R. It can be useful to reduce the ambient magnetic field to a level≤1 mG. This can be done by enclosing the interaction region in an appropriate magnetic shield. It is also desirable to avoid generation of photoelectrons by absorption of stray laser photons on electrode surfaces.

Collisions between Rydberg atoms of interest and ground state atoms as well as molecules are unlikely to cause serious difficulties. The probability w for a scattering in the time T=40 ns between the laser pulse and the acceleration pulse is estimated to be about $w << n_0 \sigma_{max} uT \approx 2 \cdot 10^{-5}$ where $u \approx 2 \cdot 10^4$ cm/s is the mean relative velocity of the Rydberg atom and ground state atom. The cross-sections for collisions of the Rydberg atom with $Cs_2$ and with background gas molecules are undoubtedly large, but the number densities of these molecules will be so small in ultra-high vacuum that they do not present serious problems.

In conclusion, the proposed source can be used in a novel low-energy scanning electron microscope with a current density on the sample of several $kA/cm^2$ and Angstrom resolution. Such resolution is achievable for two main reasons: chromatic aberration is minimized by extremely small energy spread and phase-space volume, and spherical aberration can be compensated by axial symmetric lenses. In fact, the well-defined time structure of the electron beam allows use of focusing or defocusing time-dependent fields, which allows for positive or negative spherical aberration. The ultra-bright pulsed electron source described herein improves brightness by two orders of magnitude and longitudinal emittance four orders of magnitude over existing sources. An electron source with these characteristics opens up new applications, in, for example, electron microscopy, sub-meV energy resolution, inverse photoemission spectroscopy, precise measurement of electric fields in orbital laboratories, energy exchange with tens of μeV accuracy in inelastic atomic and molecular scattering, and new ways of investigating chemical reactions and dynamics on a picosecond time scale using pump-probe techniques. Finally, the feasibility of significant phase coherence opens the possibility of electron holography and other interferometric experiments.

I claim:

1. A pulsed electron source, comprising:
   a beam of neutral atoms;
   two lasers intersecting to define, at least partially, an interaction volume, the two lasers capable of causing a first excitation, but not an ionization, of a neutral atom from the beam of neutral atoms;
   a pulsed laser at least partially defining the interaction volume, the pulsed laser capable of causing a second excitation of the neutral atom, the second excitation taking the neutral atom to an extreme Rydberg state;
   a pulsed voltage source, the voltage source capable of removing an electron from the neutral atom in the extreme Rydberg state; and
   an accelerating electric field capable of accelerating the electron to an operating energy.

2. A method of producing a pulsed electron beam, comprising:
   a) exciting a neutral atom in an interaction region to an extreme Rydberg state;
   b) extracting an electron from the neutral atom in the interaction region when the electron is at orbit apogee, thus creating an ionized atom;
   c) removing the electron from the interaction region;
   d) removing the ionized atom from the interaction region after step c;
   e) accelerating the electron to a desired operating energy, thus producing an electron pulse; and
   f) repeating steps a-e to produce a series of electron pulses.

* * * * *